(12) United States Patent
Kataoka et al.

(10) Patent No.: US 10,381,191 B2
(45) Date of Patent: Aug. 13, 2019

(54) SAMPLE HOLDER UNIT AND SAMPLE OBSERVATION APPARATUS

(71) Applicant: JEOL Ltd., Tokyo (JP)

(72) Inventors: Shogo Kataoka, Tokyo (JP); Akio Isono, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 15/966,372

(22) Filed: Apr. 30, 2018

(65) Prior Publication Data

US 2018/0330913 A1    Nov. 15, 2018

(30) Foreign Application Priority Data

May 9, 2017    (JP) ................................ 2017-093123

(51) Int. Cl.
*H01J 37/09* (2006.01)
*H01J 37/20* (2006.01)
*H01J 37/305* (2006.01)

(52) U.S. Cl.
CPC .............. *H01J 37/20* (2013.01); *H01J 37/09* (2013.01); *H01J 37/3053* (2013.01); *H01J 2237/20214* (2013.01); *H01J 2237/3151* (2013.01)

(58) Field of Classification Search
CPC ......... H01J 37/20; H01J 37/09; H01J 37/3053
USPC ....................... 250/306, 307, 440.11, 442.11
See application file for complete search history.

(56) References Cited

FOREIGN PATENT DOCUMENTS

JP               200714996 A       1/2007

*Primary Examiner* — Nicole M Ippolito
*Assistant Examiner* — Hanway Chang
(74) *Attorney, Agent, or Firm* — The Webb Law Firm

(57) ABSTRACT

A sample holder unit includes a sample holding portion, a shielding plate, and a rotating mechanism. The rotating mechanism supports the sample and the shielding plate and allows the sample and the shielding plate to rotate. The rotating mechanism is oriented such that an axis of rotation thereof is parallel to both a processing surface of the sample and a direction orthogonal to a direction of projection of the sample from the shielding plate. A center of rotation of the rotating mechanism resides on the processing surface of the sample.

7 Claims, 12 Drawing Sheets

SAMPLE HOLDER UNIT AND SAMPLE OBSERVATION APPARATUS

CROSS-REFERENCE TO RELATED APPLICATION

This application claims priority to Japanese Patent Application No. 2017-093123 filed May 9, 2017, the disclosure of which is hereby incorporated in its entirety by reference.

BACKGROUND OF THE INVENTION

1. Field of the Invention

The present invention relates to a sample holder unit that holds a sample to be used in an ion milling apparatus, and to a sample observation apparatus including the sample holder unit.

2. Description of the Related Art

In general, a sample observed under an electron microscope is etched with an ion beam emitted from an ion milling apparatus and is processed into a shape that is suitable for observation. Prior to the processing with the ion milling apparatus, the sample that is held by a sample holder is positioned relative to a shielding plate that blocks the ion beam.

A technique of positioning a sample to be processed and a shielding plate is disclosed by Japanese Unexamined Patent Application Publication No. 2007-14996. The technique employs a sample-mask unit that holds a sample, and a securing table on which the sample-mask unit is placed. The sample-mask unit to be placed on the securing table can be set obliquely with respect to the optical axis of an optical microscope under which a sample is to be observed.

In the technique disclosed by Japanese Unexamined Patent Application Publication No. 2007-14996, however, the angle of inclination of the securing table is specified. That is, the sample is observable only at the specified angle of inclination with respect to the optical axis of the optical microscope, which is an exemplary observation unit. Therefore, the technique has a problem in that it is impossible to observe the sample at an arbitrary angle of inclination with respect to the optical axis of the observation unit.

SUMMARY OF THE INVENTION

In view of the above problem, it is an object of the present invention to provide a sample holder unit and a sample observation apparatus each allowing the observation of a sample at any angle of inclination.

To solve the above problem and to achieve the above object of the present invention, a sample holder unit according to the present invention includes a sample holding portion, a shielding plate, and a rotating mechanism. The sample holding portion holds a sample. The shielding plate is provided on one side of the sample holding portion and covers part of a processing surface of the sample. The rotating mechanism supports the sample held by the sample holding portion and the shielding plate and allows the sample and the shielding plate to rotate. The sample holding portion holds the sample such that part of the sample projects from the shielding plate. The rotating mechanism is oriented such that an axis of rotation of the rotating mechanism is parallel to both the processing surface of the sample held by the sample holding portion and a direction orthogonal to a direction of projection of the sample from the shielding plate. A center of rotation of the rotating mechanism resides on the processing surface of the sample held by the sample holding portion.

A sample observation apparatus according to the present invention includes a sample holder unit that holds a sample, an attaching stage to which the sample holder unit is detachably attached, and an observation unit that faces toward the attaching stage and through which the sample held by the sample holder unit is observed.

The sample holder unit includes a sample holding portion, a shielding plate, and a rotating mechanism. The sample holding portion holds the sample. The shielding plate is provided on a side nearer to the observation unit than the sample holding portion and covers part of a processing surface of the sample. The rotating mechanism supports the sample held by the sample holding portion and the shielding plate and allows the sample and the shielding plate to rotate. The sample holding portion holds the sample such that part of the sample projects from the shielding plate. The rotating mechanism is oriented such that an axis of rotation of the rotating mechanism is orthogonal to an optical axis of the observation unit and is parallel to a direction orthogonal to a direction of projection of the sample from the shielding plate. A center of rotation of the rotating mechanism resides on the processing surface of the sample held by the sample holding portion.

With the sample holder unit and the sample observation apparatus according to the present invention, the sample can be observed at any angle of inclination thereof.

DESCRIPTION OF THE INVENTION

Embodiments of the sample holder unit and the sample observation apparatus according to the present invention will now be described with reference to FIGS. 1 to 13, wherein like elements are denoted by like reference numerals.

1. First Embodiment
1-1. Configuration of Sample Observation Apparatus

A sample observation apparatus according to a first embodiment of the present invention will first be described with reference to FIG. 1.

Figure 1:
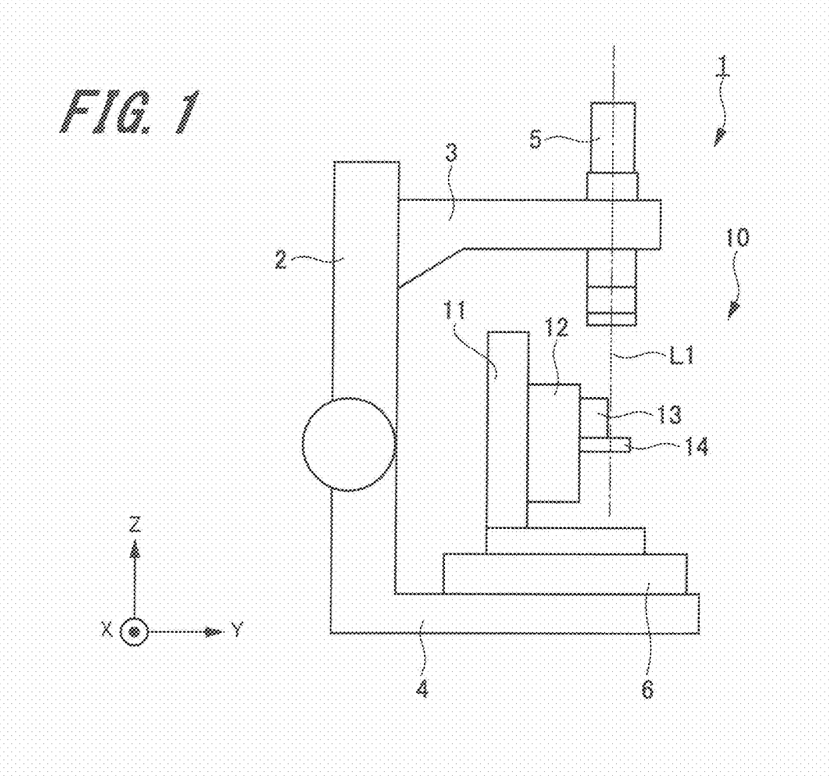
FIG. 1 is an outline diagram of a sample observation apparatus according to a first embodiment of the present invention.

FIG. 1 is an outline diagram of a sample observation apparatus 1 according to the first embodiment.

The sample observation apparatus 1 illustrated in FIG. 1 is used for, for example, the positioning of a sample to be processed by an ion milling apparatus and a shielding plate relative to each other, and the observation of the state of the processed sample. The sample observation apparatus 1 is a so-called optical microscope including an eyepiece and an objective lens.

As illustrated in FIG. 1, the sample observation apparatus 1 includes a housing 2, a supporting portion 3, an installation base 4, an observation unit 5, an attaching stage 6, and a sample holder unit 10. The supporting portion 3 is provided at one end of the housing 2. The observation unit 5 is attached to the supporting portion 3. The observation unit 5 includes an eyepiece and an objective lens. The observation unit 5 further includes a camera that takes an image of an object of observation.

The installation base 4 is provided at the other end of the housing 2 and faces toward the observation unit 5 supported by the supporting portion 3. The installation base 4 carries the attaching stage 6 on a surface thereof that faces toward the observation unit 5. The sample holder unit 10 is detachably attached to the attaching stage 6. The attaching stage 6 supports the sample holder unit 10 and is movable in a first direction X and a second direction Y that are orthogonal to an optical axis L1 of the objective lens of the observation unit 5. Hereinafter, a direction that is parallel to the optical axis L1 and is orthogonal to the first direction X and the second direction Y is referred to as a third direction Z.

1-2. Exemplary Configuration of Sample Holder Unit

An exemplary configuration of the sample holder unit 10 will now be described in detail with reference to FIGS. 1 to 5.

Figure 2:
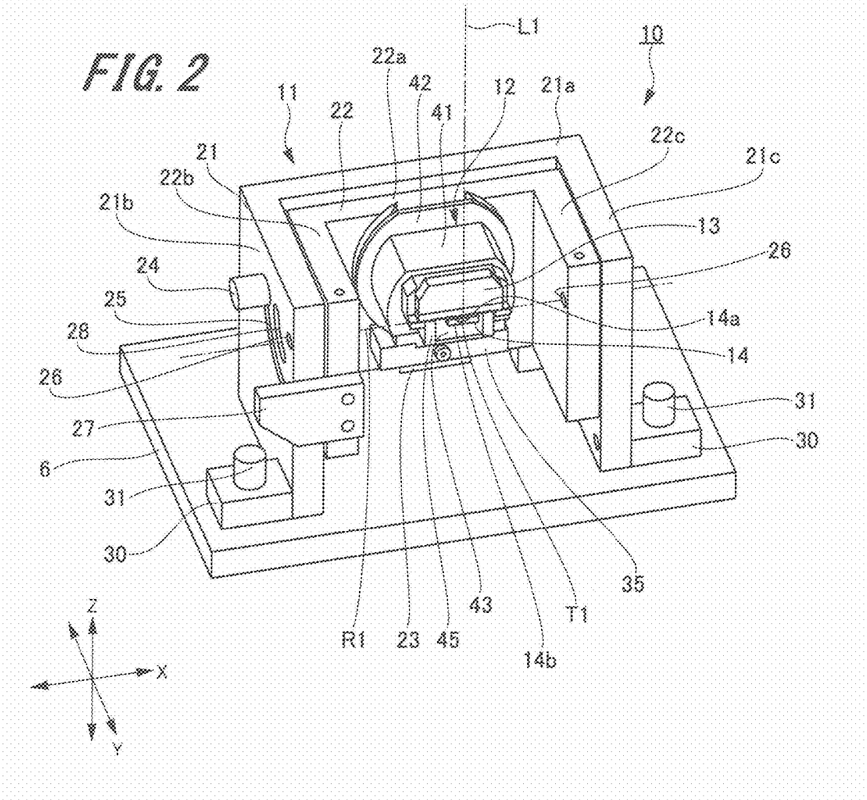
FIG. 2 is a perspective view of a sample holder unit according to the first embodiment of the present invention.

FIG. 2 is a perspective view of the sample holder unit 10.

As illustrated in FIGS. 1 and 2, the sample holder unit 10 includes a holder stand 11 and a sample holder 12. The sample holder 12 is detachably attached to the holder stand 11. The sample holder 12 releasably holds a sample 14. The sample holder 12 includes a shielding plate 13. The sample 14 is positioned on a far side with respect to the shielding plate 13, provided to the sample holder 12, in a direction of travel of an ion beam emitted from the ion milling apparatus along the optical axis L1 of the observation unit 5, i.e., in the third direction Z. Hereinafter, referring to FIG. 2, the left side and the right side in the first direction X, the near side and the far side in the second direction Y, and the upper side and the lower side in the third direction Z are referred to as "the first side" and "the second side," respectively.

Figure 3:
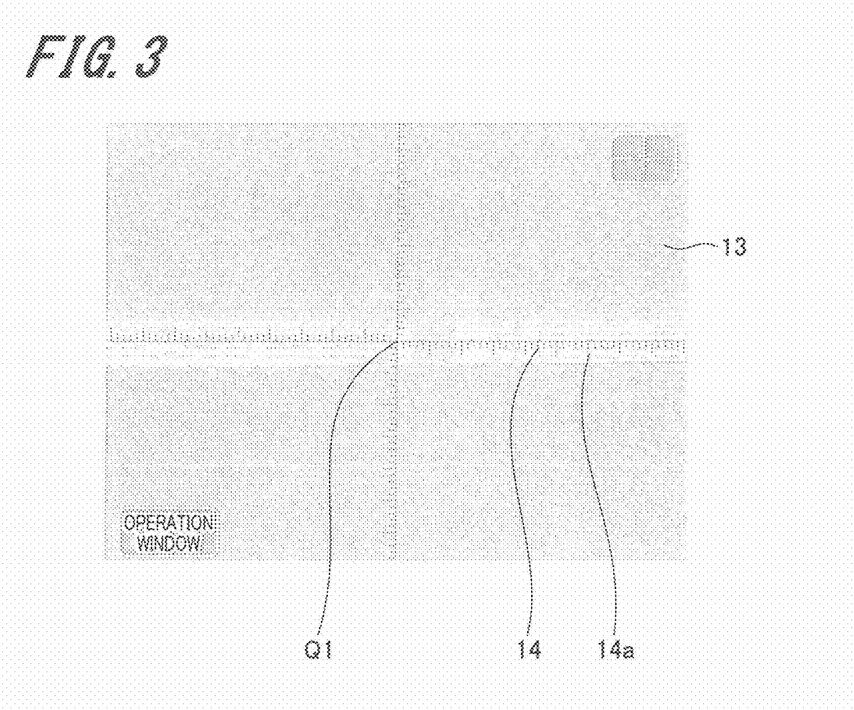
FIG. 3 is an image of a sample that is taken by an observation unit included in the sample observation apparatus according to the first embodiment of the present invention.
Figure 4:
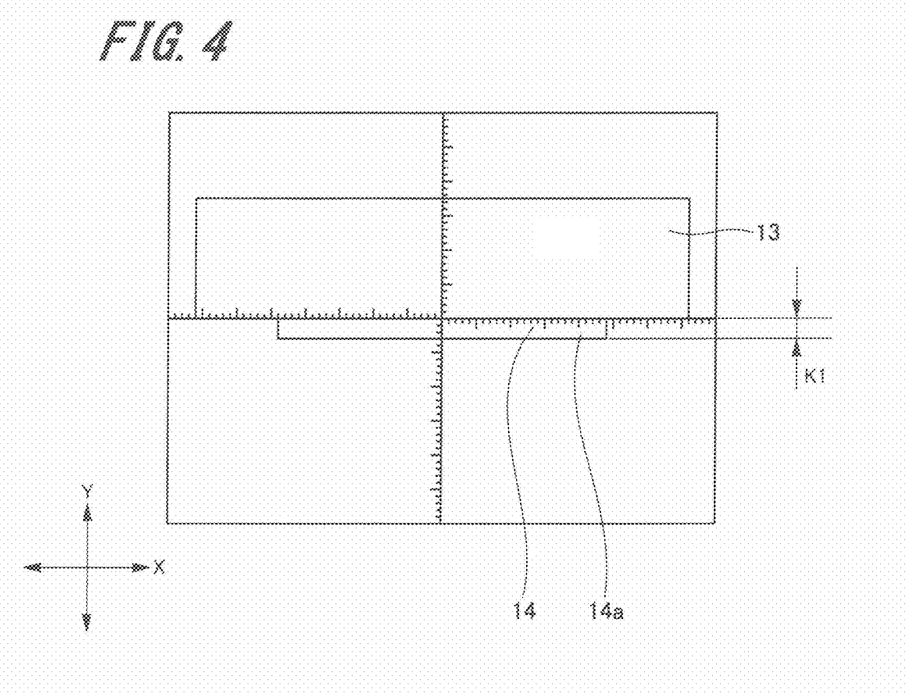
FIG. 4 is a schematic diagram illustrating a state where the sample is observed through the observation unit of the sample observation apparatus according to the first embodiment of the present invention.
Figure 5:
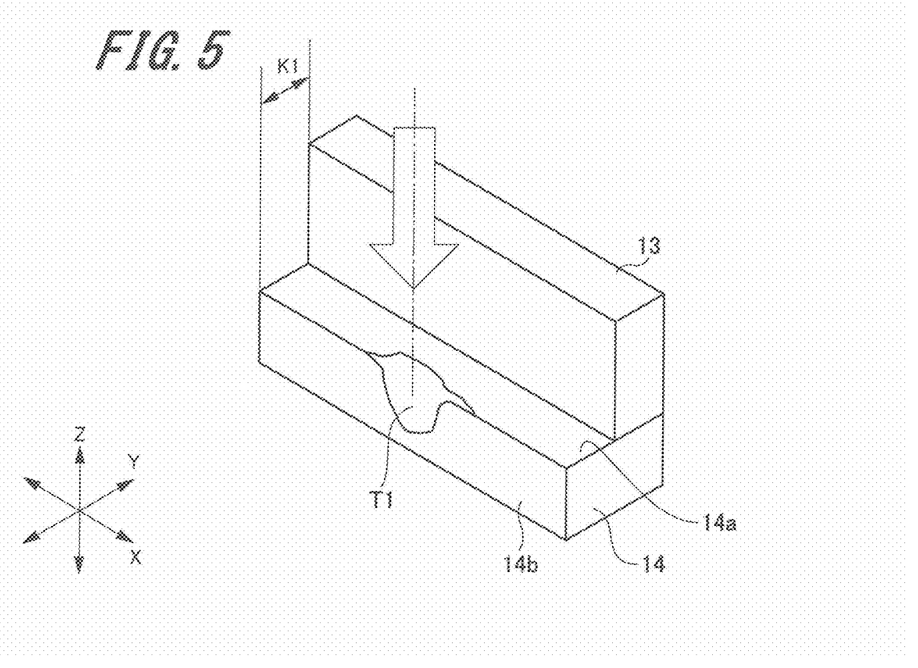
FIG. 5 is a schematic diagram illustrating the positional relationship between the sample and a shielding plate.

Referring now to FIGS. 3 to 5, the positional relationship between the shielding plate 13 and the sample 14 will be described.

FIG. 3 is an image of the sample 14 that is taken by the camera included in the observation unit 5. FIG. 4 is a schematic diagram of the image. FIG. 5 is a schematic diagram illustrating the positional relationship between the sample 14 and the shielding plate 13.

As illustrated in FIGS. 3 to 5, the sample 14 has a substantially flat plate-like shape. As illustrated in FIGS. 3 and 4, the sample 14 has a processing surface 14a that faces against the optical axis L1 of the observation unit 5 or the ion beam emitted from the ion milling apparatus, and a side surface 14b that extends substantially perpendicularly from one end of the processing surface 14a and is continuous with the processing surface 14a. The side surface 14b extends substantially parallel to the third direction Z.

When the sample 14 is held by the sample holder 12, part of the sample 14 projects from one surface of the shielding plate 13 by a predetermined length in the direction orthogonal to the optical axis L1, i.e., the third direction Z. The direction orthogonal to the optical axis L1 and the third direction Z and in which the sample 14 projects from the shielding plate 13 corresponds to the second direction Y. The direction parallel to the processing surface 14a, i.e., the direction orthogonal to the optical axis L1 and the third direction Z and orthogonal to the second direction Y corresponds to the first direction X.

The length by which the sample 14 projects in the second direction Y from the one surface of the shielding plate 13 is hereinafter denoted as length of projection K1. In the above state, the processing surface 14a, which is a surface of the sample 14 that is on one of the two sides in the third direction Z, faces against the optical axis L1 of the observation unit 5. Therefore, the ion beam emitted from the ion milling apparatus is applied to the processing surface 14a. The user adjusts the length of projection K1 and a processing position Q1 (see FIG. 3) where the processing surface 14a of the sample 14 is to be processed.

As illustrated in FIG. 5, the ion milling apparatus applies an ion beam to the processing surface 14a of the sample 14. The ion beam is blocked by the shielding plate 13 positioned on the first side in the third direction Z with respect to the sample 14. Therefore, in the sample 14 positioned on the second side in the third direction Z with respect to the shielding plate 13, a portion of the processing surface 14a that is covered by the shielding plate 13 remains unetched with the ion beam, whereas the portion of the processing surface 14a that projects from the shielding plate 13 by the length of projection K1 is etched with the ion beam. Consequently, a processed profile T1 is obtained over the processing surface 14a of the sample 14 and the side surface 14b that extends substantially perpendicularly to and continuously with the processing surface 14a.

[Holder Stand]

A configuration of the holder stand 11 included in the sample holder unit 10 will now be described.

As illustrated in FIG. 2, the holder stand 11 includes a supporting member 21, a rotatable member 22, an attachment 23, and an inclination adjusting member 24.

The supporting member 21 has a substantially rectangular U shape. The supporting member 21 includes a connecting wall portion 21a, a first supporting wall portion 21b, and a second supporting wall portion 21c. The connecting wall portion 21a, the first supporting wall portion 21b, and the second supporting wall portion 21c each have a substantially flat plate-like shape.

The first supporting wall portion 21b is at the first-side end of the connecting wall portion 21a in the first direction X. The second supporting wall portion 21c is at the second-side end of the connecting wall portion 21a in the first direction X. The first supporting wall portion 21b and the second supporting wall portion 21c extend from the respective ends of the connecting wall portion 21a substantially perpendicularly toward the first side in the second direction Y. The first supporting wall portion 21b and the second supporting wall portion 21c are opposite each other in the first direction X.

The first supporting wall portion 21b and the second supporting wall portion 21c are provided with respective rotating shafts 26 and respective securing bases 30. The securing bases 30 are each provided at the first-side end of a corresponding one of the first supporting wall portion 21b and the second supporting wall portion 21c in the second direction Y, i.e., at the end opposite the connecting wall portion 21a, and at the second-side end of the corresponding supporting wall portion 21b or 21c in the third direction Z. The securing bases 30 receive respective securing members 31 inserted thereinto and are fastened to the attaching stage 6.

Thus, the supporting member 21 is detachably attached to the attaching stage 6. In this state, the connecting wall portion 21a, the first supporting wall portion 21b, and the second supporting wall portion 21c each extend in the third direction Z from one surface of the attaching stage 6. The optical axis L1 of the observation unit 5 extends between the first supporting wall portion 21b and the second supporting wall portion 21c.

The first supporting wall portion 21b has an inclination guide portion 25 and an opening 28. The inclination guide portion 25 is a groove having a substantially arc shape centered on a corresponding one of the rotating shafts 26. The inclination guide portion 25 receives the inclination adjusting member 24, to be described below, extending therethrough and being slidable therewithin.

The opening 28 communicates with an opening (not illustrated) provided in the rotatable member 22 to be described below. Through the opening 28, a processing-position-adjusting mechanism (not illustrated) provided to the sample holder 12 attached to the holder stand 11 can be operated. Therefore, the user can adjust, through the opening 28, the length of projection K1 (see FIGS. 4 and 5) of the sample 14 held by the sample holder 12.

The rotating shafts 26 provided to the first supporting wall portion 21b and the second supporting wall portion 21c support the rotatable member 22 and allow the rotatable member 22 to rotate.

The rotatable member 22 has a substantially rectangular U shape. The rotatable member 22 is provided between the first supporting wall portion 21b and the second supporting wall portion 21c of the supporting member 21. The rotatable member 22 includes an attaching wall portion 22a, a first rotating arm 22b, and a second rotating arm 22c. The attaching wall portion 22a, the first rotating arm 22b, and the second rotating arm 22c each have a substantially flat plate-like shape.

The length of the attaching wall portion 22a in the first direction X is slightly shorter than the interval between the first supporting wall portion 21b and the second supporting wall portion 21c of the supporting member 21. The attaching wall portion 22a faces the connecting wall portion 21a of the supporting member 21 in the second direction Y. The attaching wall portion 22a is provided with the attachment 23 on a surface thereof opposite another surface thereof facing the connecting wall portion 21a.

The sample holder 12 to be described below is detachably attached to the attachment 23. A securing member 35 is provided at the second-side end, in the third direction Z, of the sample holder 12 attached to the attachment 23, i.e., at the lower end of the sample holder 12 in the vertical direction. The securing member 35 is movable along the attachment 23. The sample holder 12 attached to the attachment 23 is placed on the securing member 35. Thus, the sample holder 12 can be positioned in the third direction Z on the holder stand 11.

The first rotating arm 22b is at the first-side end of the attaching wall portion 22a in the first direction X. The second rotating arm 22c is at the second-side end of the attaching wall portion 22a in the first direction X.

The first rotating arm 22b and the second rotating arm 22c extend from the respective ends of the attaching wall portion 22a substantially perpendicularly toward the first side in the second direction Y. The first rotating arm 22b and the second rotating arm 22c are opposite each other in the first direction X. With the rotatable member 22 attached to the supporting member 21, the optical axis L1 of the observation unit 5 extends between the first rotating arm 22b and the second rotating arm 22c.

The first rotating arm 22b faces the first supporting wall portion 21b of the supporting member 21. The second rotating arm 22c faces the second supporting wall portion 21c of the supporting member 21. The first rotating arm 22b is rotatably supported by the first supporting wall portion 21b with the aid of the corresponding rotating shaft 26. The second rotating arm 22c is rotatably supported by the second supporting wall portion 21c with the aid of the corresponding rotating shaft 26. That is, the rotatable member 22 is rotatably supported by the supporting member 21 with the aid of the rotating shafts 26.

The axis of rotation of the rotatable member 22 is orthogonal to the third direction Z, which is parallel to the optical axis L1. That is, the axis of rotation of the rotatable member 22 is set parallel to the processing surface 14a of the sample 14 held by the sample holder 12 to be described below. The axis of rotation of the rotatable member 22 is also orthogonal to the second direction Y, which is parallel to the direction of projection of the sample 14 from the shielding plate 13. That is, the axis of rotation of the rotatable member 22 is set parallel to the first direction X.

A center of rotation R1 of the rotatable member 22 resides on the processing surface 14a of the sample 14 held by the sample holder 12. More specifically, the center of rotation R1 resides on the boundary between the shielding plate 13 provided on the sample holder 12 to be described below and the processing surface 14a of the sample 14.

The first rotating arm 22b is provided with the inclination adjusting member 24. The inclination adjusting member 24 extends through the inclination guide portion 25 provided in the first supporting wall portion 21b. The inclination adjusting member 24 is slidably supported by the inclination guide portion 25.

The inclination adjusting member 24 has an external threaded portion that is screwed into the first rotating arm 22b. The inclination adjusting member 24 is fastened to the first rotating arm 22b with the first supporting wall portion 21b interposed therebetween, whereby the first supporting wall portion 21b is squeezed between the inclination adjusting member 24 and the first rotating arm 22b. Therefore, the rotatable member 22 can be retained at an arbitrary angle with respect to the optical axis L1 by the inclination adjusting member 24 and the supporting member 21.

The first rotating arm 22b is provided with a grip portion 27 at the first-side end thereof in the second direction Y. The grip portion 27 projects toward the first side in the first direction X. The grip portion 27 is to be gripped by the user. Specifically, the user can loosen the inclination adjusting member 24 and operate the grip portion 27, thereby being capable of rotating the rotatable member 22.

The rotatable member 22 described above and the rotating shafts 26 form a rotating mechanism to be described below that rotates the sample 14 and the shielding plate 13.

While the first embodiment concerns a case where the first rotating arm 22b and the second rotating arm 22c of the rotatable member 22 each have a flat plate-like shape, the present invention is not limited to such an embodiment. The first rotating arm 22b and the second rotating arm 22c may each have any of other various shapes, such as a round columnar or rectangular columnar bar-like shape, or a tongue-like shape that is shorter in the third direction Z than the attaching wall portion 22a.

[Sample Holder]

The sample holder 12 will now be described.

The sample holder 12 includes the shielding plate 13, a holder body 41, a holder-side attachment 42, a sample mounting table 43, and sample holding portions 45. The holder-side attachment 42 is detachably attached to the attachment 23 of the holder stand 11. Thus, the sample holder 12 is positioned between the first rotating arm 22b and the second rotating arm 22c in the holder stand 11. The holder-side attachment 42 is provided with the holder body 41 on a surface thereof that is opposite another surface thereof facing the attachment 23.

The holder body 41 projects from the holder-side attachment 42 toward the first side in the second direction Y. The shielding plate 13 is secured to the first-side end of the holder body 41 in the second direction Y. The shielding plate 13 is made of a material having higher strength with respect to the ion beam than the sample 14. The shielding plate 13 blocks the ion beam emitted from the ion milling apparatus.

The sample mounting table 43 and the sample holding portions 45 are provided on the second side of the holder body 41 in the third direction Z with respect to the shielding plate 13, i.e., on the downstream side in the direction of the optical axis L1 of the observation unit 5 or the downstream side in the direction of travel of the ion beam emitted from the ion milling apparatus. The sample mounting table 43 carries the sample 14 mounted thereon. The surface of the sample mounting table 43 on which the sample 14 is mounted extends parallel to the first direction X.

The sample 14 is held between the shielding plate 13 and the sample mounting table 43. The sample 14 is pressed against the shielding plate 13 by the sample mounting table 43, whereby the sample 14 and the shielding plate 13 come into close contact with each other. Consequently, the gap between the sample 14 and the shielding plate 13 can be eliminated, and the occurrence of defects in the processing performed in the ion milling apparatus can be prevented.

The sample holding portions 45 are provided on both sides, in the first direction X, of the sample 14 mounted on the sample mounting table 43. The sample holding portions 45 hold the sample 14 from the respective sides in the first direction X. Therefore, the sample 14 is positioned by the sample mounting table 43 and the sample holding portions 45 such that the processing surface 14a extends parallel to the first direction X.

The holder body 41 is provided with the processing-position-adjusting mechanism (not illustrated) that moves the sample holding portions 45 in the first direction X and in the second direction Y. The sample holding portions 45 move in the first direction X and in the second direction Y with the sample 14 held therebetween. Consequently, the length of projection K1 (see FIGS. 4 and 5) of the sample 14 from the shielding plate 13 can be adjusted.

While the first embodiment concerns a case where the sample holder 12 is capable of moving the sample 14 in the first direction X and in the second direction Y, the present invention is not limited to such an embodiment. The sample holder 12 may be capable of moving the sample 14 only in the second direction Y so as to adjust the length of projection K1.

1-3. Exemplary Operation of Sample Holder Unit

An exemplary operation of the sample holder unit 10 configured as above will now be described with reference to FIGS. 2 and 6 to 10.

Figure 6:
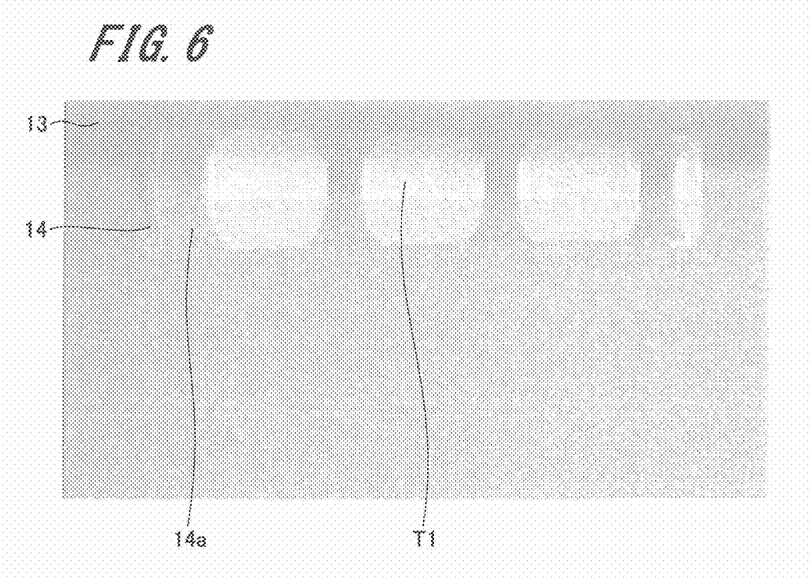
FIG. 6 is an image of the sample on the sample holder unit in the state illustrated in FIG. 2.
Figure 7:
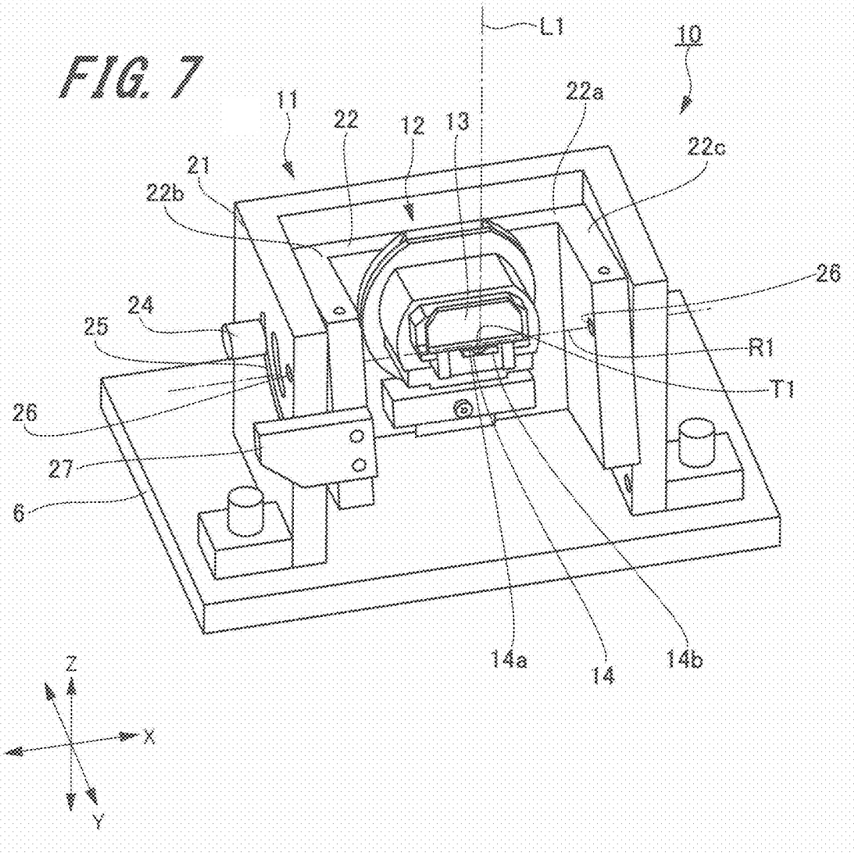
FIG. 7 is a perspective view of the sample holder unit according to the first embodiment of the present invention, with the sample and the shielding plate rotated by an arbitrary angle.
Figure 8:
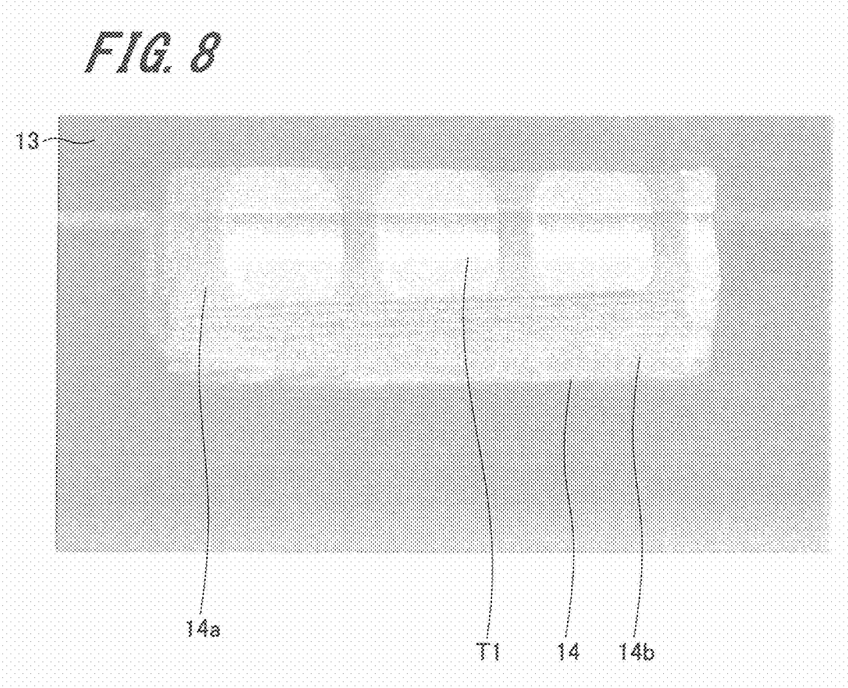
FIG. 8 is an image of the sample on the sample holder unit in the state illustrated in FIG. 7.

FIG. 6 is an image of the sample 14 on the sample holder unit 10 in the state illustrated in FIG. 2. FIG. 7 is a perspective view of the sample holder unit 10, with the rotatable member 22 rotated by an arbitrary angle. FIG. 8 is an image of the processed sample 14 on the sample holder unit 10 in the state illustrated in FIG. 7.

In the state illustrated in FIG. 2, the processing surface 14a of the sample 14 is orthogonal to the optical axis L1 and is not inclined. In this state, the processing surface 14a of the sample 14 projects from the sample holder 12 in the direction parallel to the second direction Y. Referring to FIGS. 3 and 6, the length of projection K1 of the sample 14 from the shielding plate 13 can be checked in the image taken in the above state.

The user loosens the inclination adjusting member 24. Thus, the rotatable member 22 becomes rotatable relative to the supporting member 21 by an arbitrary angle about the rotating shafts 26. Hence, the user holds the grip portion 27 and rotates the rotatable member 22 by a desired angle. The inclination adjusting member 24 is slidably fitted in the inclination guide portion 25 of the supporting member 21. Therefore, the rotatable member 22 is rotatable relative to the supporting member 21 with no backlash. In this step, the sample holder 12 and the sample 14 and the shielding plate 13 that are held by the sample holder 12 also rotate along with the rotatable member 22.

Then, the user fastens the inclination adjusting member 24 to the rotatable member 22 at a position corresponding to the desired angle of the rotatable member 22. Thus, as illustrated in FIG. 7, the first supporting wall portion 21b is squeezed between the inclination adjusting member 24 and the first rotating arm 22b, whereby the rotatable member 22 is retained at the desired angle of inclination with respect to the optical axis L1.

As described above, the center of rotation R1 of the rotatable member 22 resides on the processing surface 14a of the sample 14 held by the sample holder 12. Therefore, even if the rotatable member 22 is rotated by an arbitrary angle, the interval between the observation unit 5 and the sample 14 in the third direction Z and the position of the sample 14 in each of the first direction X and the second direction Y relative to the optical axis L1 do not change. Accordingly, even if the sample 14 is rotated along with the rotatable member 22, the sample 14 is not displaced from the focal position of the observation unit 5. Consequently, the focal point of the observation unit 5 does not need to be adjusted even if the sample 14 is rotated. Therefore, the observation of the sample 14 is facilitated.

When the sample 14 is inclined with respect to the optical axis L1, not only the state of the processing surface 14a of the sample 14 but also the state of the side surface 14b of the sample 14 can be observed as illustrated in FIG. 8.

When the processing surface 14a of the sample 14 faces toward the observation unit 5 as illustrated in FIG. 2, the processing surface 14a of the sample 14 and the shielding plate 13 may cause diffused reflection of illuminating light emitted from the observation unit 5. Such diffused reflection of the illuminating light may hinder the observation of the state of the processing surface 14a of the sample 14.

In contrast, when the sample 14 is inclined with respect to the optical axis L1 as illustrated in FIG. 7, the diffused reflection on the processing surface 14a that may be caused by the illuminating light emitted from the observation unit 5 can be reduced. Therefore, the states of the processing surface 14a and the side surface 14b can be observed clearly.

When the sample 14 is observed obliquely, the degree of closeness between the sample 14 and the shielding plate 13 and the states of the processing surface 14a and the side surface 14b of the sample 14 can be observed at a time.

Figure 9:
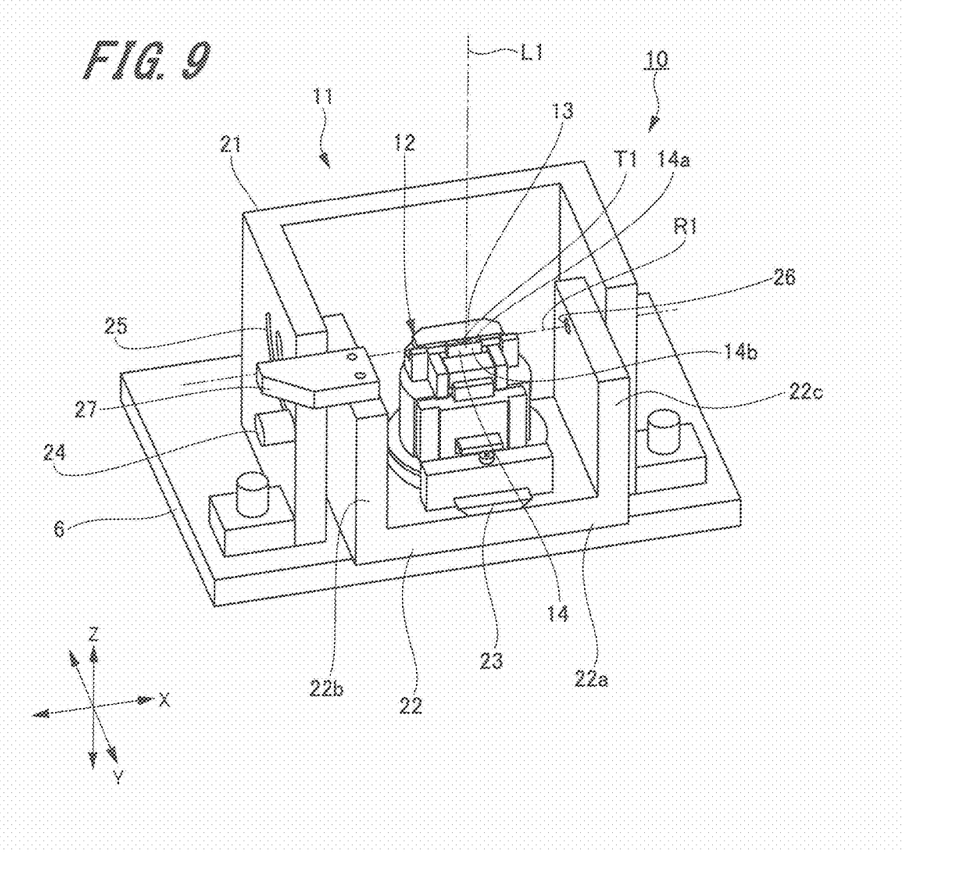
FIG. 9 is a perspective view of the sample holder unit according to the first embodiment of the present invention, with the sample and the shielding plate rotated by 90 degrees.
Figure 10:
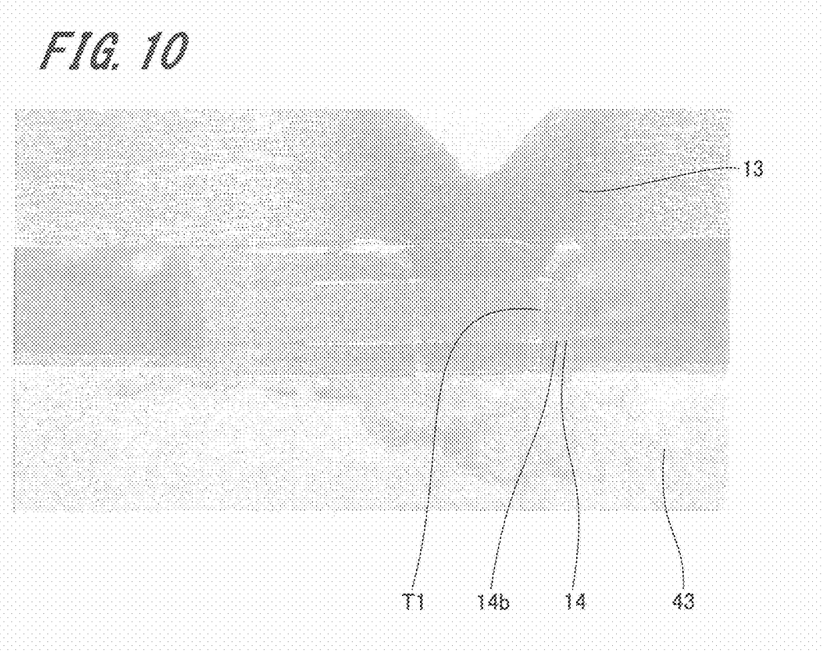
FIG. 10 is an image of the sample processed and observed on the sample holder unit in the state illustrated in FIG. 9.

FIG. 9 is a perspective view of the rotatable member 22 rotated by 90 degrees. FIG. 10 is an image of the sample 14 processed and observed on the sample holder unit 10 in the state illustrated in FIG. 9.

When the inclination adjusting member 24 is loosened and the rotatable member 22 is further rotated by using the grip portion 27, the rotatable member 22 can be rotated by 90 degrees with respect to the optical axis L1 as illustrated in FIG. 9 from the state illustrated in FIG. 2. In this case, the center of rotation R1 of the rotatable member 22 also resides on the processing surface 14a of the sample 14 held by the sample holder 12. Therefore, the focal point of the observation unit 5 does not need to be adjusted again.

As illustrated in FIG. 10, not only the state of the processed profile T1 obtained in the sample 14 but also the degree of closeness between the sample 14 and the shielding plate 13 can be observed.

As described above, with each of the sample observation apparatus 1 and the sample holder unit 10 according to the first embodiment, the rotating mechanism formed of the rotatable member 22 and the rotating shafts 26 allows the observation of the sample 14 at an arbitrary angle of inclination with respect to the optical axis L1.

2. Second Embodiment

A sample holder unit according to a second embodiment will now be described with reference to FIGS. 11 to 13.

Figure 11:
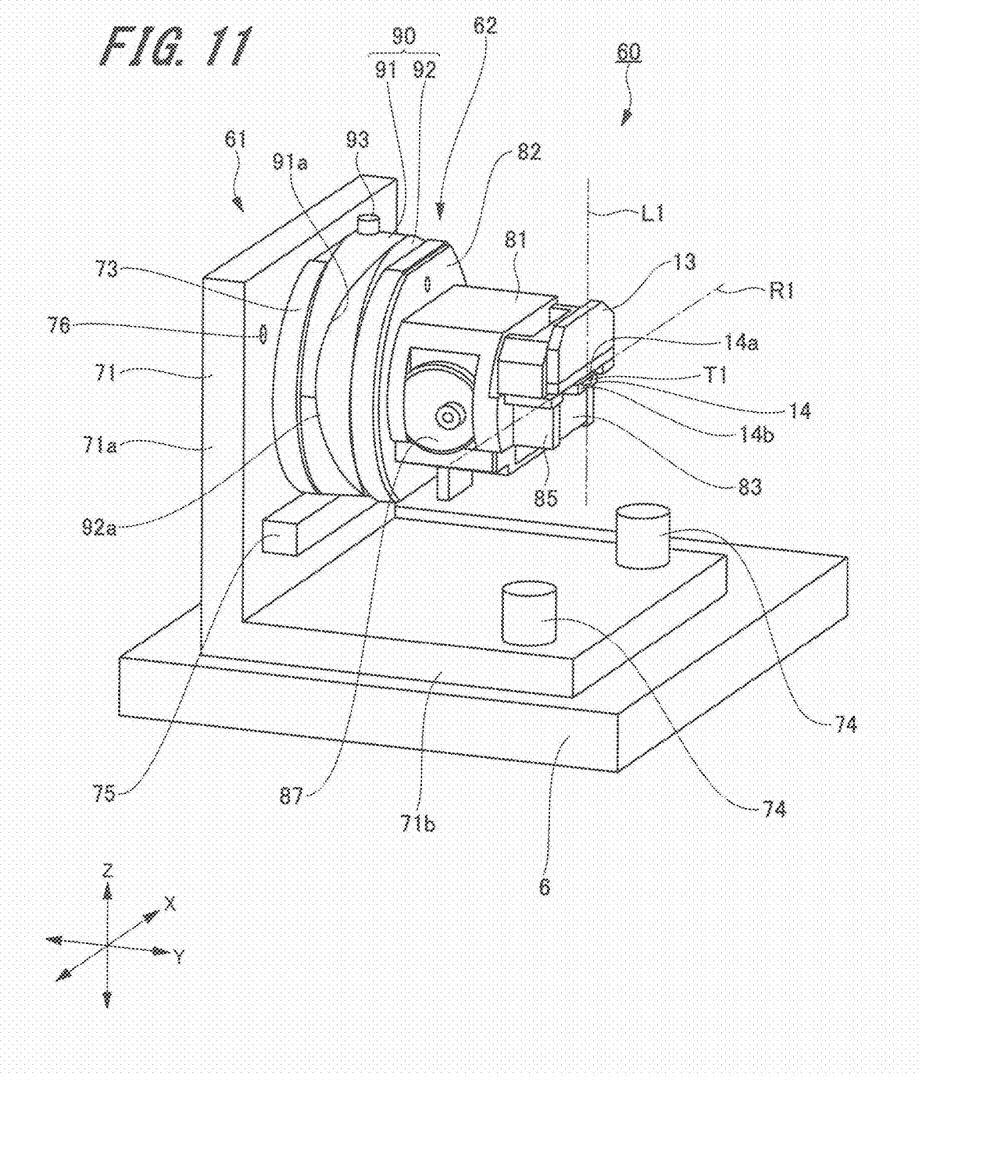
FIG. 11 is a perspective view of a sample holder unit according to a second embodiment of the present invention.
Figure 12:
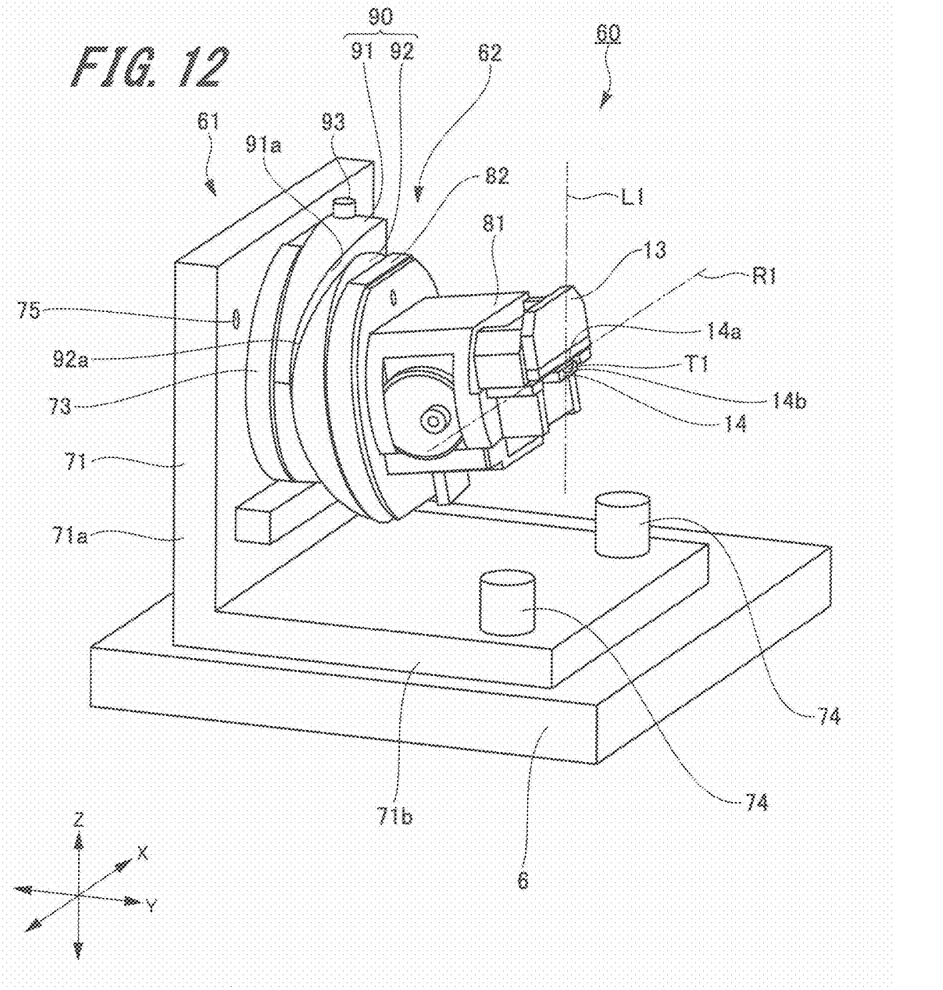
FIG. 12 is a perspective view of the sample holder unit according to the second embodiment of the present invention, with a sample and a shielding plate rotated by an arbitrary angle.
Figure 13:
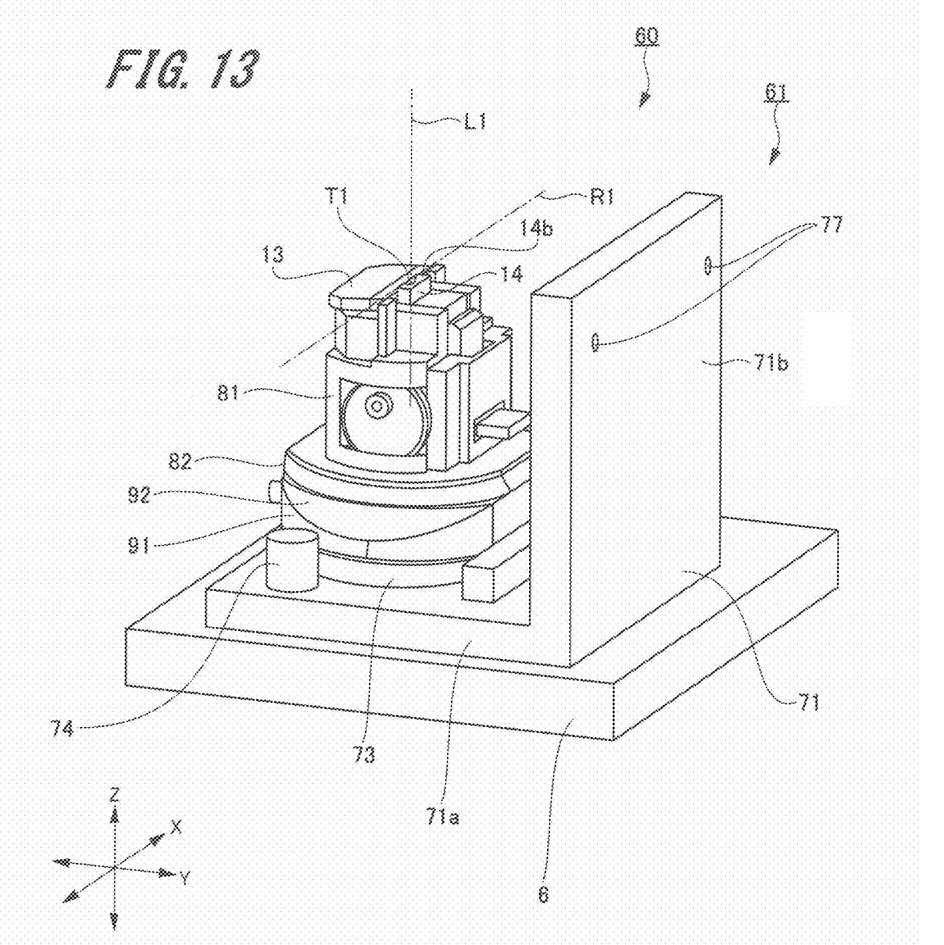
FIG. 13 is a perspective view of the sample holder unit according to the second embodiment of the present invention, with the sample and the shielding plate rotated by 90 degrees.

FIGS. 11 to 13 are perspective views of a sample holder unit 60 according to the second embodiment.

The sample holder unit 60 according to the second embodiment differs from the sample holder unit 10 according to the first embodiment in that the rotating mechanism is provided to the sample holder. Therefore, elements that are the same as those of the sample holder unit 10 according to the first embodiment are denoted by corresponding ones of the reference numerals used in the first embodiment, and redundant description of such elements is omitted.

Referring to FIG. 11, the sample holder unit 60 includes a holder stand 61, and a sample holder 62 provided with the shielding plate 13. The sample holder 62 releasably holds the sample 14.

[Holder Stand]

The holder stand 61 includes a supporting member 71, an attachment 73, securing members 74, and a securing base 75. The supporting member 71 has a substantially L shape. The supporting member 71 includes a first supporting wall portion 71a and a second supporting wall portion 71b. The first supporting wall portion 71a and the second supporting wall portion 71b each have a substantially flat plate-like shape.

The second supporting wall portion 71b extends from the second-side end, in the third direction Z, of the first supporting wall portion 71a substantially perpendicularly toward the first side in the second direction Y and is continuous with the first supporting wall portion 71a. The first supporting wall portion 71a is provided with the attachment 73 to which the sample holder 62 to be described below is detachably attached. The securing base 75 is provided at the second-side end of the attachment 73 in the third direction Z.

The first supporting wall portion 71a has securing holes 76. Likewise, the second supporting wall portion 71b has securing holes 77 (see FIG. 13). If the sample 14 is not inclined with respect to the optical axis L1, the second supporting wall portion 71b is placed on the attaching stage 6 and is fastened thereto with the securing members 74 fitted into the securing holes 77, respectively. Thus, the supporting member 71 is detachably attached to the attaching stage 6.

If the sample 14 is inclined by 90 degrees with respect to the optical axis L1, the first supporting wall portion 71a is placed on the attaching stage 6 as illustrated in FIG. 13 and is fastened thereto with the securing members 74 fitted into the securing holes 76, respectively.

[Sample Holder]

The sample holder 62 will now be described.

The sample holder 62 includes the shielding plate 13, a holder body 81, a holder supporting portion 82, a sample mounting table 83, sample holding portions 85, a processing-position-adjusting mechanism 87, and a rotating mechanism 90.

The rotating mechanism 90 includes a rotation support member 91, a slide member 92, and an inclination adjusting member 93. The rotation support member 91 is detachably attached to the attachment 73. The rotation support member 91 has a sliding support surface 91a on a side thereof that is opposite another side thereof facing the attachment 73. The sliding support surface 91a is an arc-shaped curved surface that is concave toward the second side in the second direction Y. The slide member 92 is movably supported on the sliding support surface 91a.

The slide member 92 has a slide surface 92a that faces the sliding support surface 91a. The slide surface 92a is an arc-shaped curved surface that is convex toward the second side in the second direction Y. The radius of curvature of the sliding support surface 91a of the rotation support member 91 and the radius of curvature of the slide surface 92a of the slide member 92 are equal.

The center of curvature of the sliding support surface 91a and the center of curvature of the slide surface 92a reside on the processing surface 14a of the sample 14 held between the sample holding portions 85. The slide member 92 rotates by moving along the sliding support surface 91a.

The axis of rotation of the slide member 92 is orthogonal to the third direction Z, which is parallel to the optical axis L1. The axis of rotation of the slide member 92 is also orthogonal to the second direction Y, which is parallel to the direction of projection of the sample 14 from the shielding plate 13. That is, the axis of rotation of the slide member 92 is parallel to the first direction X. The center of rotation R1 of the slide member 92 resides on the processing surface 14a of the sample 14 held by the sample holder 62. More specifically, the center of rotation R1 resides on the boundary between the shielding plate 13 and the processing surface 14a of the sample 14.

The rotation support member 91 is provided with the inclination adjusting member 93. When the inclination adjusting member 93 is operated by the user, the slide member 92 moves along the sliding support surface 91a. Thus, the angle of inclination of the slide member 92 with respect to the optical axis L1 can be adjusted.

The holder supporting portion 82 is secured to a surface of the slide member 92 that is opposite another surface thereof facing the sliding support surface 91a. The holder body 81 is provided on a surface of the holder supporting portion 82 that is opposite another surface thereof facing the slide member 92, i.e., on the first side of the holder supporting portion 82 in the second direction Y.

The holder body 81 projects from the holder supporting portion 82 toward the first side in the second direction Y. As with the case of the holder body 41 according to the first embodiment, the holder body 81 is provided with the shielding plate 13, the sample mounting table 83, and the sample holding portions 85. The configurations of the sample mounting table 83 and the sample holding portions 85 are the same as those of the sample mounting table 43 and the sample holding portions 45 according to the first embodiment, and description thereof is omitted.

The holder body 81 is provided with the processing-position-adjusting mechanism 87. When the processing-position-adjusting mechanism 87 is operated by the user, the sample holding portions 85 and the sample 14 held between the sample holding portions 85 are moved in the first direction X and in the second direction Y. Thus, the length of projection K1 (see FIGS. 4 and 5) of the sample 14 from the shielding plate 13 can be adjusted.

An exemplary operation of the sample holder unit 60 according to the second embodiment that is configured as above will now be described.

If the slide member 92 is not moved from the rotation support member 91 as illustrated in FIG. 11, the processing surface 14a of the sample 14 projects from the sample holder 62 in the direction parallel to the second direction Y. Therefore, the processing surface 14a of the sample 14 is orthogonal to the optical axis L1 with no inclination.

Hence, in the sample holder unit 60 according to the second embodiment, an image such as the one given in FIG. 6 can also be taken by the observation unit 5 and be observed through the observation unit 5 as in the case of the sample holder unit 10 according to the first embodiment.

The user operates the inclination adjusting member 93 to move the slide member 92 along the sliding support surface 91a of the rotation support member 91. Accordingly, the slide member 92, the holder body 81, the shielding plate 13, and the sample 14 rotate on the center of rotation R1. Thus, as illustrated in FIG. 12, the slide member 92, the holder body 81, the shielding plate 13, and the sample 14 can be made to incline at an arbitrary angle of inclination with respect to the optical axis L1.

As described above, the center of rotation R1 resides on the processing surface 14a of the sample 14 held by the sample holder 62. Therefore, even if the slide member 92 is rotated by an arbitrary angle, the interval between the observation unit 5 and the sample 14 in the third direction Z and the position of the sample 14 in each of the first direction X and the second direction Y relative to the optical axis L1 do not change. Consequently, the focal point of the observation unit 5 does not need to be adjusted even if the sample 14 is rotated. Therefore, the observation of the sample 14 is facilitated.

When the sample holder unit 60 is oriented as illustrated in FIG. 12, an image such as the one given in FIG. 8 can also be taken by the observation unit 5 and be observed through the observation unit 5 as in the case of the sample holder unit 10 according to the first embodiment.

Now, a case where the processing surface 14a of the sample 14 is rotated by 90 degrees with respect to the optical axis L1 will be described with reference to FIG. 13.

First, the user operates the inclination adjusting member 93 to return the slide member 92 from the orientation illustrated in FIG. 12 to the orientation illustrated in FIG. 11. Then, as illustrated in FIG. 13, the first supporting wall portion 71a of the supporting member 71 included in the holder stand 61 is placed on the surface of the attaching stage 6. Furthermore, the securing members 74 are fitted into the securing holes 76 provided in the first supporting wall portion 71a and are fastened to the attaching stage 6. Thus, the processing surface 14a of the sample 14 held by the sample holder 62 is rotated by 90 degrees with respect to the optical axis L1.

The position of the center of rotation R1 of the sample 14 in the third direction Z in the orientation illustrated in FIG. 13 is set to the same as the position of the center of rotation R1 of the sample 14 in the third direction Z in the orientation illustrated in FIG. 11. Consequently, the interval between the observation unit 5 and the sample 14 in the third direction Z does not change. Therefore, the focal point of the observation unit 5 does not need to be adjusted again.

When the sample holder unit 60 is oriented as illustrated in FIG. 13, an image such as the one given in FIG. 10 can also be taken by the observation unit 5 and be observed through the observation unit 5 as in the case of the sample holder unit 10 according to the first embodiment.

The other configurations are the same as those of the sample holder unit 10 according to the first embodiment, and description thereof is omitted. The sample holder unit 60 configured as above also produces the advantageous effects produced by the sample holder unit 10 according to the first embodiment.

In the sample holder unit 60 according to the second embodiment, the rotating mechanism 90 is provided to the sample holder 62. Therefore, the holder stand 61 may be omitted, and the sample holder 62 may be attached to the ion milling apparatus. In this state, the sample 14 and the shielding plate 13 can be made to incline with respect to the ion beam emitted from the ion milling apparatus.

The present invention is not limited to the embodiments described above and illustrated in the drawings and may be modified in various ways without departing from the essence thereof defined by the claims.

While the above embodiments each concern a case where the sample observation apparatus is applied to an optical microscope, the present invention is not limited to such an embodiment. The sample observation apparatus may be applied to an ion milling apparatus including an observation unit for observing a sample, and an ion-beam-applying unit that applies an ion beam to the sample; or any of other various apparatuses.

While the above embodiments each concern a case where the sample and the shielding plate are rotated with a hand of the user, the present invention is not limited to such an embodiment. For example, the rotating shafts 26 according to the first embodiment or the rotating mechanism 90 according to the second embodiment may be provided with a transmission mechanism that transmits a driving force generated by a motor, so that the sample and the shielding plate can be rotated by the motor.

While the terms such as "parallel" and "orthogonal" have been used herein, these terms do not necessarily mean the exact "parallel" state and the exact "orthogonal" state. These terms imply states including not only the exact "parallel" state and the exact "orthogonal" state but also any "substantially parallel" state and any "substantially orthogonal" state in which relevant elements can exert their functions.

What is claimed is:

1. A sample holder unit comprising:
a sample holding portion that holds a sample;
a shielding plate that is provided on one side of the sample holding portion and covers part of a processing surface of the sample; and
a rotating mechanism that supports the sample held by the sample holding portion and the shielding plate and allows the sample and the shielding plate to rotate,
wherein the sample holding portion holds the sample such that part of the sample projects from the shielding plate,
wherein the rotating mechanism is oriented such that an axis of rotation of the rotating mechanism is parallel to both the processing surface of the sample held by the sample holding portion and a direction orthogonal to a direction of projection of the sample from the shielding plate, and
wherein a center of rotation of the rotating mechanism resides on the processing surface of the sample held by the sample holding portion.

2. The sample holder unit according to claim 1, further comprising:
a sample holder comprising the sample holding portion and the shielding plate; and
a holder stand to which the sample holder is detachably attached,
wherein the rotating mechanism is provided to the holder stand.

3. The sample holder unit according to claim 2,
wherein the holder stand comprises:
an attachment to which the sample holder is detachably attached;
a rotatable member on which the attachment is provided; and
a supporting member that supports the rotatable member and allows the rotatable member to rotate.

4. The sample holder unit according to claim 1, further comprising:
a sample holder including the sample holding portion and the shielding plate,
wherein the rotating mechanism is provided to the sample holder.

5. The sample holder unit according to claim 4,
wherein the rotating mechanism comprises
a rotation support member having an arc-shaped sliding support surface; and
a slide member movably supported by the sliding support surface of the rotation support member, and
wherein the sample holding portion and the shielding plate are provided on the slide member.

6. The sample holder unit according to claim 1, further comprising:
an inclination adjusting member that retains the sample and the shielding plate at an arbitrary angle of inclination.

7. A sample observation apparatus comprising:
a sample holder unit that holds a sample;
an attaching stage to which the sample holder unit is detachably attached; and
an observation unit that faces toward the attaching stage and through which the sample held by the sample holder unit is observed,
wherein the sample holder unit comprises
a sample holding portion that holds the sample;
a shielding plate that is provided on a side nearer to the observation unit than the sample holding portion and covers part of a processing surface of the sample; and
a rotating mechanism that supports the sample held by the sample holding portion and the shielding plate and allows the sample and the shielding plate to rotate,
wherein the sample holding portion holds the sample such that part of the sample projects from the shielding plate,
wherein the rotating mechanism is oriented such that an axis of rotation of the rotating mechanism is orthogonal to an optical axis of the observation unit and is parallel to a direction orthogonal to a direction of projection of the sample from the shielding plate, and
wherein a center of rotation of the rotating mechanism resides on the processing surface of the sample held by the sample holding portion.

* * * * *